US006762076B2

(12) United States Patent
Kim et al.

(10) Patent No.: US 6,762,076 B2
(45) Date of Patent: Jul. 13, 2004

(54) PROCESS OF VERTICALLY STACKING MULTIPLE WAFERS SUPPORTING DIFFERENT ACTIVE INTEGRATED CIRCUIT (IC) DEVICES

(75) Inventors: Sarah E. Kim, Portland, OR (US); R. Scott List, Beaverton, OR (US); Scot A. Kellar, Bend, OR (US)

(73) Assignee: Intel Corporation, Santa Clara, CA (US)

( * ) Notice: Subject to any disclaimer, the term of this patent is extended or adjusted under 35 U.S.C. 154(b) by 54 days.

(21) Appl. No.: 10/077,967

(22) Filed: Feb. 20, 2002

(65) Prior Publication Data

US 2003/0157748 A1 Aug. 21, 2003

(51) Int. Cl.⁷ ............................................. H01L 21/44
(52) U.S. Cl. .................. 438/107; 438/455; 438/625; 438/640
(58) Field of Search ................ 438/640, 107, 438/455, 458, 459, 625, 626

(56) References Cited

U.S. PATENT DOCUMENTS

| | | | | | |
|---|---|---|---|---|---|
| 5,455,445 | A | * | 10/1995 | Kurtz et al. | 257/777 |
| 5,473,197 | A | * | 12/1995 | Idaka et al. | 257/786 |
| 5,627,106 | A | * | 5/1997 | Hsu | 438/459 |
| 5,880,010 | A | * | 3/1999 | Davidson | 438/459 |
| 5,998,808 | A | * | 12/1999 | Matsushita | 257/777 |
| 6,100,181 | A | * | 8/2000 | You et al. | 438/626 |
| 2001/0038148 | A1 | * | 11/2001 | Mastromatteo et al. | 257/758 |

OTHER PUBLICATIONS

"Ultra Thin Electronics for Space Applications", 2001 Electronic Components and Technology Conference, 2001 IEEE, 5 pages.
"Copper Wafer Bonding"; A. Fan, A. Rahman, and R. Reif; Electrochemical and Solid–State Letters, 2 (10) 534–536 (1999).
"Face to Face Wafer Bonding for 3D Chip Stack Fabrication to Shorten Wire Lengths", Jun. 27–29, 2000 VMIC Conference 2000 IMIC—200/00/0090(c), 90–96.
"InterChip Via Technology for Vertical System Integration", Fraunhofer Institute for Reliability and Microintegration, Munich, Germany, Infineon Technologies AG, Munich, Germany, 2001 IEEE, 160–162.

* cited by examiner

Primary Examiner—Michael Trinh
(74) Attorney, Agent, or Firm—Jay Beale

(57) ABSTRACT

A method of vertically stacking wafers is provided to form three-dimensional (3D) wafer stack. Such method comprising: selectively depositing a plurality of metallic lines on opposing surfaces of adjacent wafers; bonding the adjacent wafers, via the metallic lines, to establish electrical connections between active devices on vertically stacked wafers; and forming one or more vias to establish electrical connections between the active devices on the vertically stacked wafers and an external interconnect. Metal bonding areas on opposing surfaces of the adjacent wafers can be increased by using one or more dummy vias, tapered vias, or incorporating an existing copper (Cu) dual damascene process.

9 Claims, 7 Drawing Sheets

Si Via that processed during STI steps

PROCESS OF VERTICALLY STACKING MULTIPLE WAFERS SUPPORTING DIFFERENT ACTIVE INTEGRATED CIRCUIT (IC) DEVICES

TECHNICAL FIELD

The present invention relates to a semiconductor process and, more specifically, relates to process of vertically stacking multiple wafers supporting different active IC devices on a single die with low cost and high via density with optimum metal bonding areas.

BACKGROUND

Integrated circuits (ICs) form the basis for many electronic systems. Essentially, an integrated circuit (IC) includes a vast number of transistors and other circuit elements that are formed on a single semiconductor wafer or chip and are interconnected to implement a desired function. The complexity of these integrated circuits (ICs) requires the use of an ever increasing number of linked transistors and other circuit elements.

Many modern electronic systems are created through the use of a variety of different integrated circuits; each integrated circuit (IC) performing one or more specific functions. For example, computer systems include at least one microprocessor and a number of memory chips. Conventionally, each of these integrated circuits (ICs) is formed on a separate chip, packaged independently and interconnected on, for example, a printed circuit board (PCB).

As integrated circuit (IC) technology progresses, there is a growing desire for a "system on a chip" in which the functionality of all of the IC devices of the system are packaged together without a conventional PCB. Ideally, a computing system should be fabricated with all the necessary IC devices on a single chip. In practice, however, it is very difficult to implement a truly high-performance "system on a chip" because of vastly different fabrication processes and different manufacturing yields for the logic and memory circuits.

As a compromise, various "system modules" have been introduced that electrically connect and package integrated circuit (IC) devices which are fabricated on the same or on different semiconductor wafers. Initially, system modules have been created by simply stacking two chips, e.g., a logic and memory chip, one on top of the other in an arrangement commonly referred to as chip-on-chip structure. Subsequently, multi-chip module (MCM) technology has been utilized to stack a number of chips on a common substrate to reduce the overall size and weight of the package, which directly translates into reduced system size.

Existing multi-chip module (MCM) technology is known to provide performance enhancements over single chip or chip-on-chip (COC) packaging approaches. For example, when several semiconductor chips are mounted and interconnected on a common substrate through very high density interconnects, higher silicon packaging density and shorter chip-to-chip interconnections can be achieved. In addition, low dielectric constant materials and higher wiring density can also be obtained which lead to the increased system speed and reliability, and the reduced weight, volume, power consumption and heat to be dissipated for the same level of performance. However, MCM approaches still suffer from additional problems, such as bulky package, wire length and wire bonding that gives rise to stray inductances that interfere with the operation of the system module.

An advanced three-dimensional (3D) wafer-to-wafer vertical stack technology has been recently proposed by researchers to realize the ideal high-performance "system on a chip" as described in "*Face To Face Wafer Bonding For 3D Chip Stack Fabrication To Shorten Wire Lengths*" by J. F. McDonald et al., Rensselaer Polytechnic Institute (RPI) presented on Jun. 27–29, 2000 VMIC Conference, and "*Copper Wafer Bonding*" by A. Fan et al., Mass. Institute of Technology (MIT), Electrochemical and Solid-State Letters, 2 (10) 534–536 (1999). In contrast to the existing multi-chip module (MCM) technology which seeks to stack multiple chips on a common substrate, 3-D wafer-to-wafer vertical stack technology seeks to achieve the long-awaited goal of vertically stacking many layers of active IC devices such as processors, programmable devices and memory devices inside a single chip to shorten average wire lengths, thereby reducing interconnect RC delay and increasing system performance.

One major challenge of 3-D wafer-to-wafer vertical stack integration technology is the bonding between wafers and between die in a single chip. In the RPI publication, polymer glue is used to bond the vertically stacked wafers. In the MIT publication, copper (Cu) is used to bond the vertically stacked wafers; however, a handle (carrier wafer) is required to transport thinly stacked wafers and a polymer glue is also used to affix the handle on the top wafer during the vertically stacked wafer processing. As a result, there is a need for a simpler but more efficient process of vertically stacking multiple wafers supporting different active IC devices on a single die with low cost and high via density with optimum metal bonding areas.

BRIEF DESCRIPTION OF THE DRAWINGS

A more complete appreciation of exemplary embodiments of the present invention, and many of the attendant advantages of the present invention, will become readily apparent as the same becomes better understood by reference to the following detailed description when considered in conjunction with the accompanying drawings in which like reference symbols indicate the same or similar components, wherein.

DETAILED DESCRIPTION

The present invention is applicable for use with all types of semiconductor wafers and integrated circuit (IC) devices, including, for example, MOS transistors, CMOS devices, MOSFETs, and new memory devices and communication devices such as smart card, cellular phone, electronic tags, gaming devices which may become available as semiconductor technology develops in the future. However, for the sake of simplicity, discussions will concentrate mainly on exemplary use a three-dimensional (3-D) wafer-to-wafer vertical stack, although the scope of the present invention is not limited thereto.

Figure 1:
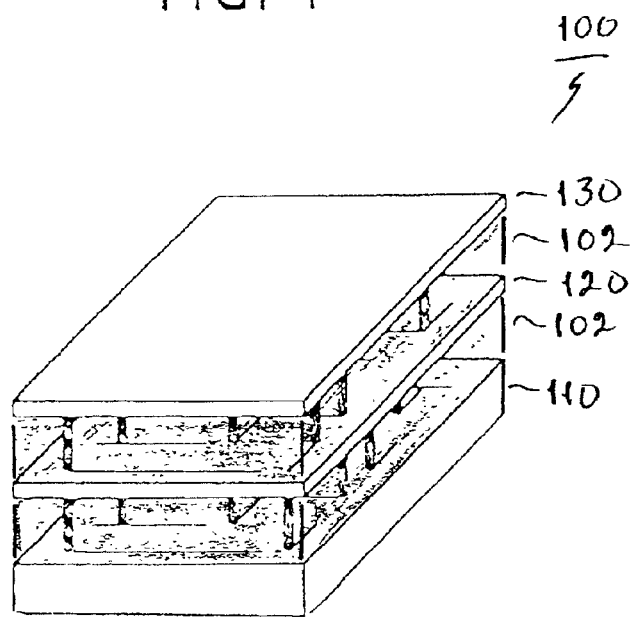
FIG. 1 illustrates an example three-dimensional (3-D) wafer-to-wafer vertical stack forming a single chip.

Attention now is directed to the drawings and particularly to FIG. 1, an example three-dimensional (3-D) wafer-to-wafer vertical stack is illustrated. As shown in FIG. 1, the 3-D vertical stack (chip) 100 may comprise any number of active device polysilicon (Si) wafers, such as wafer #1 110 including, for example, one or more microprocessors; wafer #2 120 including one or more memory devices; and wafer #3 130 including one or more radio-frequency (RF) or optical communication devices. Typically, a dielectric layer 102 is used to bond the active device wafers 110, 120 and 130.

According to one aspect of the present invention, however, a metal to metal bond can be used to stack wafers 110, 120 and 130 to form the vertical stack 100. This metal to metal bond method may serve not only as electrical connections to active IC devices on the vertically stacked wafers 110, 120 and 130 on a 3-D wafer-to-wafer vertical stack 100 but also bond adjacent wafers 110, 120 and 130. Dummy metal bonding pads can also be made to increase the surface area for wafer to wafer bonding and serve as auxiliary structures such as ground planes or heat conduits for the active IC devices. In addition, improved etch stop layers for the Si via etch can be used in vertically stacked wafer processing (i.e., 3-D interconnect processing) which provide more efficient electrical conductivity between vertically stacked wafers 110, 120 and 130.

Figure 2:
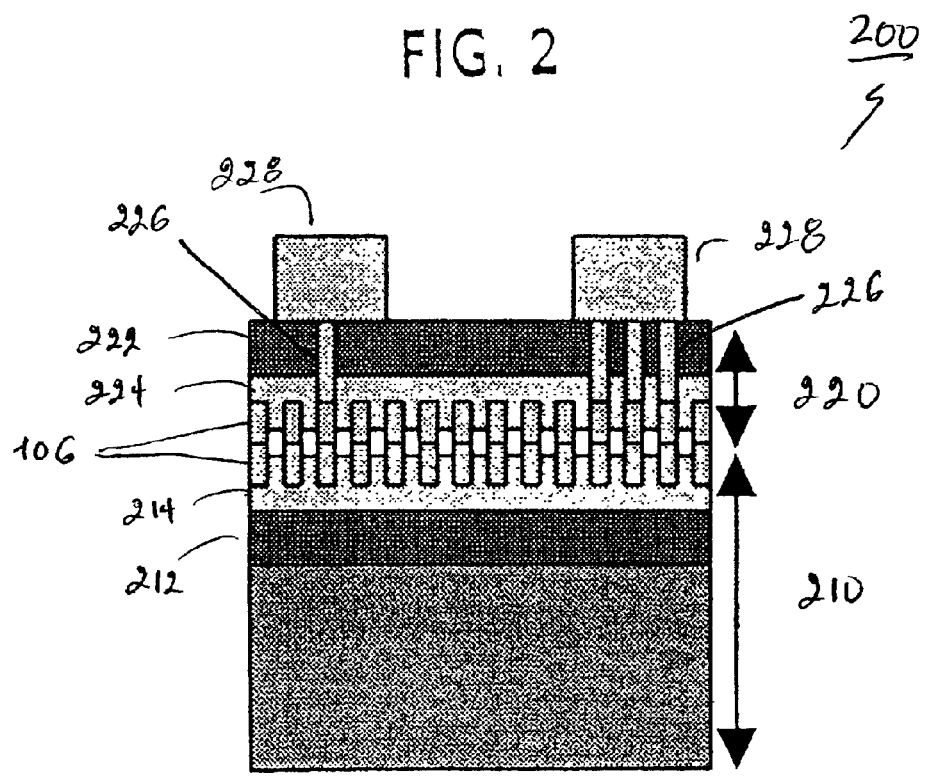
FIG. 2 illustrates an example 2-wafer vertical stack according to an embodiment of the present invention.

Turning now to FIG. 2, an example three-dimensional (3-D) wafer-to-wafer vertical stack according to an embodiment of the present invention is illustrated. Specifically, FIG. 2 illustrates an example 2-wafers vertical stack 200. However, the number of wafers in a vertical stack is not limited hereto. Through 3-D interconnect structure, wiring between vertically stacked wafers can be shortened resulting a faster signal and minimal interconnect RC delays. In addition, the vertical stack can effectively integrate diverse process technologies on a single wafer process, such as, for example, logic/memory stacking, processor stacking, optical interconnect, system-on-chip, and RF interconnect.

As shown in FIG. 2, the bottom silicon (Si) wafer 210 may include an active silicon (Si) layer 212 supporting one or more active IC devices (not shown), and an interlayer dielectric (ILD) layer 214. Likewise, the top Si wafer 220 may also include an active silicon (Si) layer 222 supporting one or more active IC devices (not shown), and an interlayer dielectric (ILD) layer 224. In both wafers 210 and 220, the ILD layers 214 and 224 are shown as a single layer respectively for purposes of simplification. In practice, the ILD layers 214 and 224 may comprise a stack or composite of dielectric material. Typically, the ILD layers 214 and 224 may be oxide deposited on the respective active silicon (Si) layers 212 and 222. In addition, the bottom wafer 210 can be made thick to support the stacking of the top wafer 220, while the top wafer 220 can be made thinned to minimize interconnection lengths between vertically stacked wafers 210 and 220. The wafers 210 and 220 can also be aligned using a standard alignment tool and bonded, via a metal bonding layer 106 deposited on opposing surfaces of the bottom wafer 210 and the top wafer 220 at designated bonding areas to establish electrical connections between active IC devices on vertically stacked wafers 210 and 220 and to bond adjacent wafers 210 and 220, while maintaining electrical isolation between bonding areas via ILD layers 214 and 224.

In the example 2-wafer vertical stack 200 shown in FIG. 2, the metal bonding process between adjacent wafers 210 and 220 may be performed in a vacuum or an inert gas environment, and a dielectric recess can be made surrounding the metal bonding areas, e.g., the metal bonding layer 106 to facilitate direct metal bonding between adjacent wafers 210 and 220 to ensure that the adjacent wafers 210 and 220 are bonded, while maintaining electrical isolation between the metal bonding areas. The metal bonding layer 106 may include a plurality of interconnect metallic lines deposited on opposing surfaces of the vertically stacked wafers 210 and 220 that can be used for metal diffusion bonding while serving as electrical contacts between active IC devices on the vertically stacked wafers 210 and 220. Copper (Cu) or Cu alloy may be selected because of its low electrical resistivity, high electro-migration resistance and high diffusivity. However, other metallic materials can also be used, including, for example, tin, indium, gold, nickel, silver, palladium, palladium-nickel alloy, titanium, or any combination thereof.

After the wafer bonding process is completed, the top wafer 220 can also be thinned for a subsequent silicon (Si) via process. Thereafter, one or more interwafer (interconnect) vias (or via holes) 226 can be etched, via the top wafer 220, to establish electrical connections between active IC devices on the vertically stacked wafers 210 and 220 and an external interconnect (not shown), via a C4 bump 228. Interwafer vias 226 can be formed employing damascene technology, that is, forming an opening, e.g., a damascene opening in the ILD layer 224 through the active layer 222, depositing a diffusion barrier layer, typically tantalum (Ta), titanium (Ti), or tungsten (W), and filling the opening with copper (Cu) or a Cu alloy. The opening in the ILD layer 224 can be filled by initially depositing a seed layer and then electroplating the copper (Cu) or Cu alloy layer. The seed layer typically comprises copper (Cu), though other materials such as refractory metals have been suggested. Both the seed layer and barrier layer are typically deposited by a Physical Vapor Deposition (PVD) process and, for purposes of simplification, can be referred to as a single barrier/seed layer. Chemical Mechanical Polish (CMP) can then be performed such that the upper surface of the Cu or Cu alloy layer is substantially coplanar with the upper surface of the active Si layer 222.

Figure 3A:
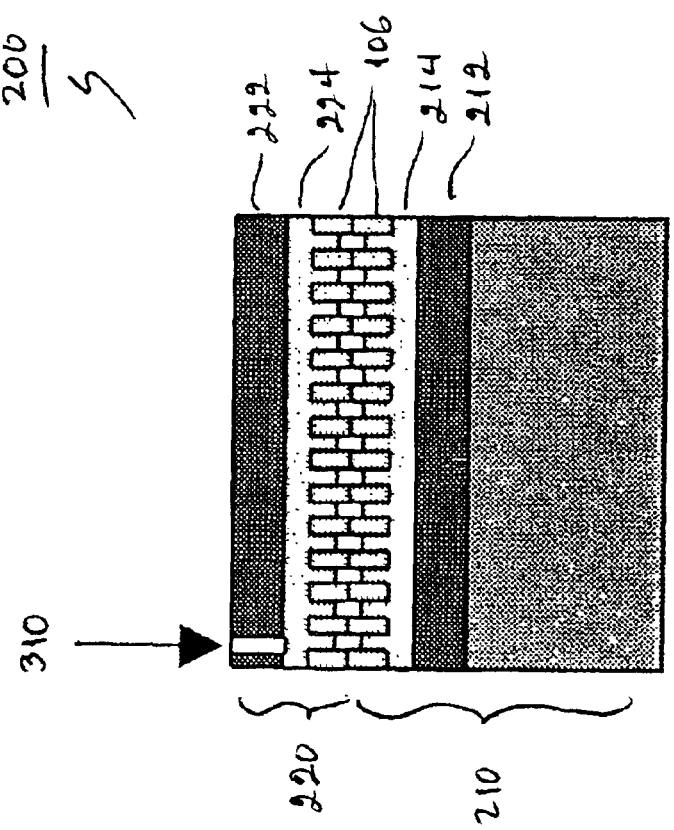
FIGS. 3A–3C illustrate an example wafer bond and via etch in an example 2-wafer vertical stack as shown in FIG. 2.
Figure 3B:
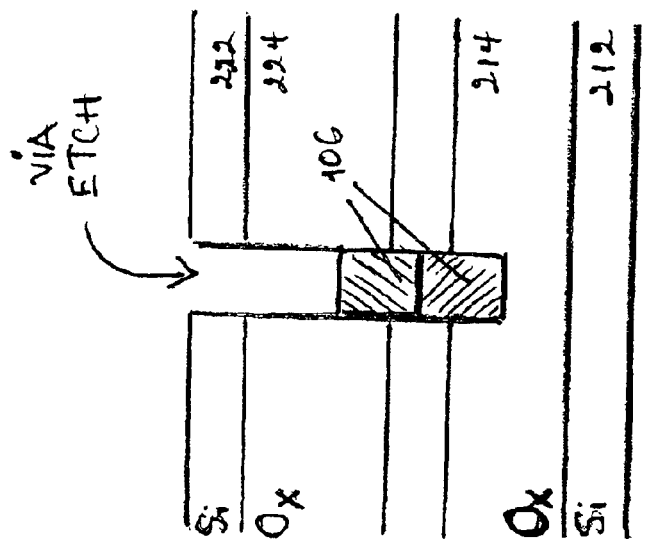
Figure 3C:
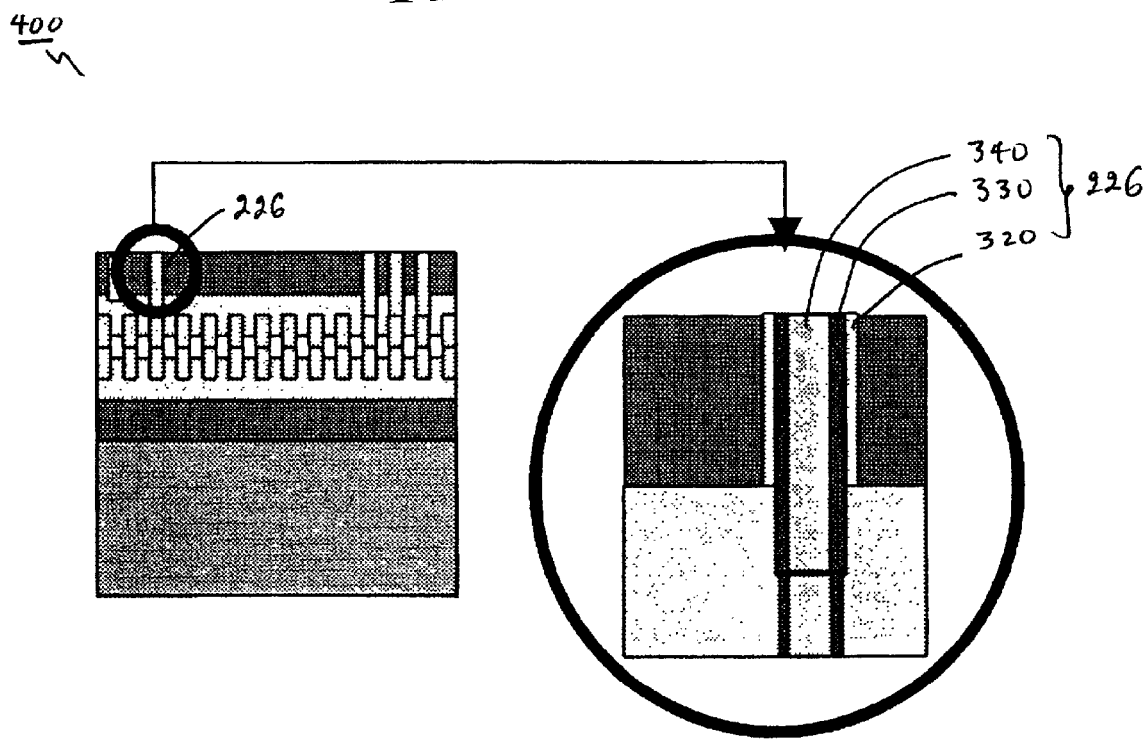

FIGS. 3A–3C illustrate an example process of vertically stacking multiple wafers in an example three-dimensional (3-D) wafer-to-wafer vertical stack shown in FIG. 2. Each of the adjacent wafers 210 and 220 contains an active Si layer (212 and 222) for supporting one or more active IC devices (not shown), an oxide layer (214 and 224) and an identical set of metallic lines formed by the metal bonding layer 106 to dispose in the oxide layer (214 and 224) of the adjacent wafers 210 and 220 for serving not only as electrical connections to active IC devices on adjacent wafers 210 and 220 but also for bonding the adjacent wafers 210 and 220. Metallic lines on the oxide layer 214 and 224 of the adjacent wafers 210 and 220 can be formed by etching the oxide layer 214 and 224 using an etch mask and then filling etched areas (trenches) on the oxide layer 214 and 224 with copper (Cu), Cu alloy or other selected metallic materials as described with reference to FIG. 2.

As shown in FIG. 3A, an alignment mark 310 may be used to facilitate the face to face alignment between the top wafer 220 and the bottom wafer 210 before the wafers 210 and 220 are ready for bonding. If the alignment mark 310 is needed, an oxide trench alignment mark can be processed on the top wafer 220. When both wafers 210 and 220 are ready for bonding, the wafers 210 and 220 are aligned using a standard alignment tool and bonded using metal to metal bond, via a metal bonding layer 106. After the wafers 210 and 220 are bonded, the top wafer 220 may be thinned by a Chemical Mechanical Polish (CMP), grinding, or Silicon (Si) wet etch process so as to minimize the wiring length between the vertically stacked wafers 210 and 220.

For example, the top wafer 220 is typically 700–760 $\mu$m of silicon (Si). After the wafer-to-wafer bonding and silicon (Si) thinning processes are completed, one or more interwafer vias (or via holes) 226 can be formed at designated locations to establish electrical connections between active IC devices on the vertically stacked wafers 210 and 220 and an external interconnect (not shown). The interwafer vias 226 can be patterned by conventional lithography and the active silicon (Si) on the top wafer 220 can be etched using an etch mask.

As shown in FIG. 3B, the active silicon (Si) layer 222 of the top wafer 220 is etched using an etch mask to pattern one or more vias 226. Via etch can be performed by several techniques. For example, the silicon (Si) layer 222 of the top wafer 220 can be etched first stopping at the oxide layer 224. A thin layer of oxide 320 can then be deposited in the Si vias 226, as shown in FIG. 3C, so as to protect and insulate the sidewall of the Si vias 226. Then oxide via (oxide layer 320 and ILD 224) can be etched using an etch mask, stopping on a barrier/seed layer 330. In other words, a silicon (Si) via etch is first performed stopping at the oxide layer 224 to form Si vias 226. Oxide is then deposited in the Si vias 226 and an oxide via etch is performed, leaving behind a thin layer of oxide 320 deposited on a sidewall of the interwafer vias 226.

In another example technique, the silicon (Si) layer 222 and the oxide layer 224 of the top wafer 220 can be etched in the same step. A thin layer of oxide 320 can then be deposited on the interwafer vias 226 so as to protect and insulate the sidewall of the interwafer vias 226. Then anisotropic oxide etch can be performed to remove the thin layer of oxide 320 at the bottom of the interwafer vias 226. In other words, the silicon (Si) via etch and the oxide via etch are performed at the same time. Oxide is then deposited in the interwafer vias 226 and anisotropic oxide via etch is performed to clear a thin layer of oxide at the bottom of the interwafer vias 226.

After the oxide etch or the anisotropic oxide etch, a barrier/seed layer 330 can then deposited inside the oxide via. Such a barrier/seed layer 330 contains a barrier layer deposited on the oxide layer 320 and a seed layer deposited on the barrier layer using, for example, a Chemical Vapor Deposition (CVD) process. The barrier layer can be a single or a stack of materials selected from the groups of tantalum (Ta), tantalum nitride (TaN), titanium (Ti), and tungsten (W). The seed layer can be a few layers of copper (Cu) atoms deposited on the barrier layer by a Chemical Vapor Deposition (CVD) process.

After the barrier/seed layer 330, copper (Cu) 340 can then be deposited in the interwafer vias 226, via electroplating and Chemical Mechanical Polish (CMP), to establish electrical connections of active IC devices between vertically stacked wafers 210 and 220 to an external interconnect, via the C4 bump 228 shown in FIG. 2.

Figure 4:
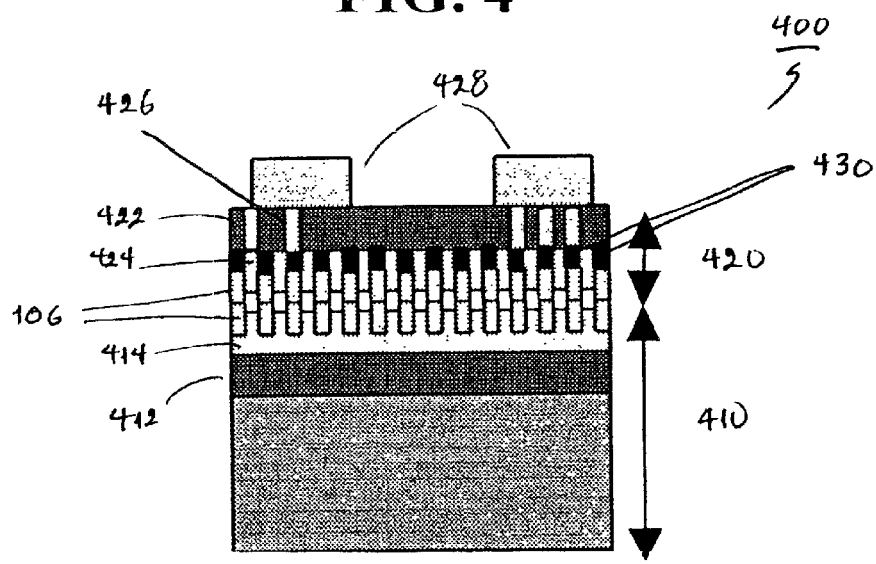
FIG. 4 illustrates an example 2-wafer vertical stack according to another embodiment of the present invention.

FIG. 4 illustrates an example 3-D wafer-to-wafer vertical stack 400 according to another embodiment of the present invention. As shown in FIG. 4, the bottom silicon (Si) wafer 410 may include an active silicon (Si) layer 412 supporting one or more active IC devices (not shown), and an interlayer dielectric (ILD) layer 414. Likewise, the top Si wafer 420 may also include an active silicon (Si) layer 422 supporting one or more active IC devices (not shown), and an interlayer dielectric (ILD) layer 424. In both wafers 410 and 420, the ILD layer 414 and 424 are oxide deposited on the respective active silicon (Si) layer 412 and 422. The wafers 410 and 420 can then be aligned and bonded, via a metal bonding layer 106 deposited on opposing surfaces of the bottom wafer 410 and the top wafer 420 at designated bonding areas to establish electrical connections between active IC devices on vertically stacked wafers 410 and 420 and to bond adjacent wafers 410 and 420, while maintaining electrical isolation between bonding areas via an ILD layer 414 and 424. One or more interwafer vias 426 can be etched, via the top wafer 420, to establish electrical connections between active IC devices on the vertically stacked wafers 410 and 420 and an external interconnect (not shown), via a C4 bump 228.

However, in the example 2-wafer vertical stack 400 shown in FIG. 4, a conductive plug 430 filling a via hole (or hole like via) is formed during a standard W contact process to serve as an etch stop to stop the silicon (Si) via etch before the wafers 410 and 420 are bonded so as to establish electrical contact with an active region, via the copper (Cu) lines (the metal bonding layer 106) of the vertically stacked wafers 410 and 420. Such a conductive plug 430 filling a via hole (trench) is typically formed by forming an opening through the dielectric oxide by conventional photolithographic and etching techniques, and filling the opening with a conductive material such as tungsten "W". Copper (Cu) lines are then used for metal diffusion bonding and serve as electrical contacts between active IC devices on the vertically stacked wafers 410 and 420. Tungsten "W" conductive plug 430 serves as an etch stop to stop the silicon (Si) via etch in order to avoid the requirement of a high selectivity etch process to stop at a thin barrier layer as described with reference to FIGS. 3A–3C.

Figure 5B:
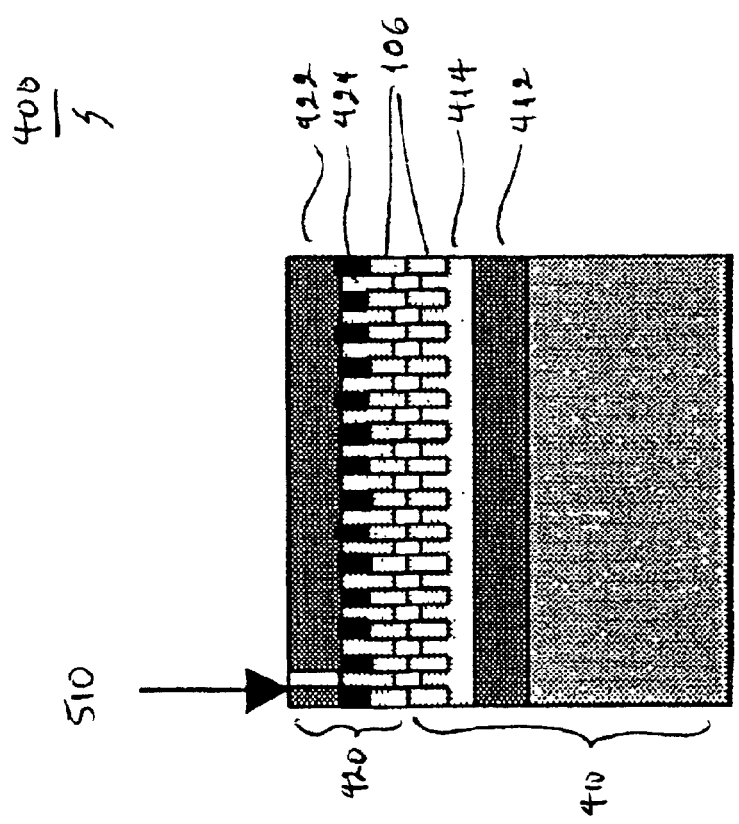
FIGS. 5A–5C illustrate an example wafer bond and via etch in an example 2-wafer vertical stack as shown in FIG. 4.
Figure 5A:
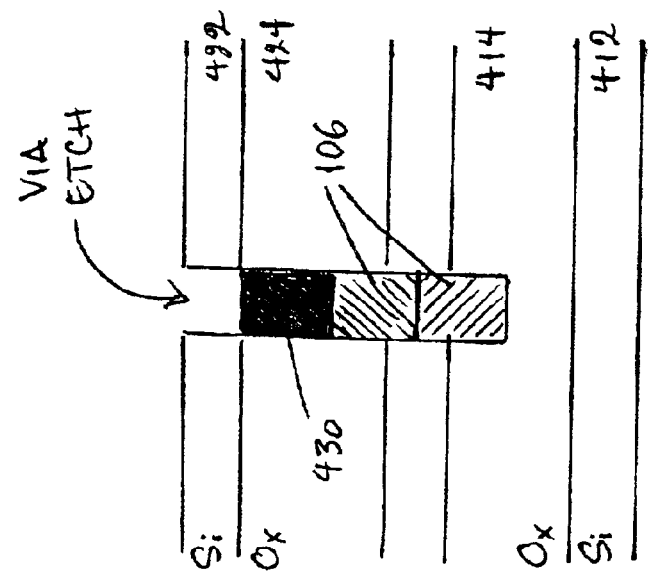
Figure 5C:
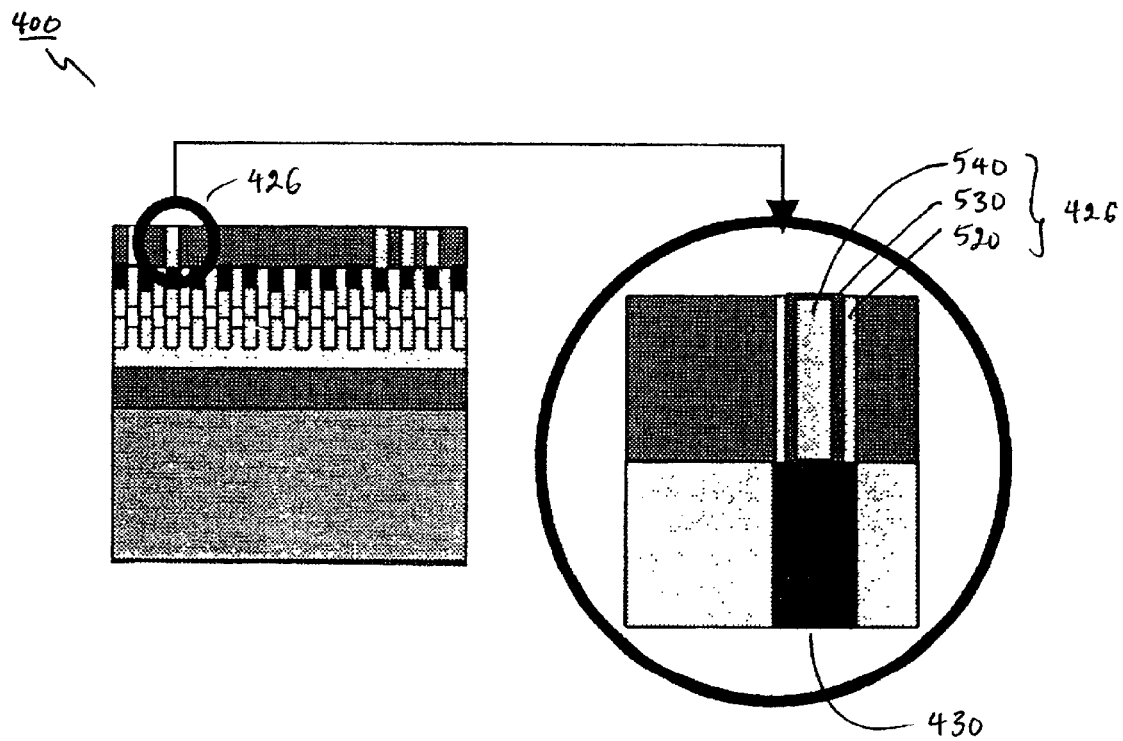

FIGS. 5A–5C illustrate an example wafer bond and via etch in an example 3-D wafer-to-wafer vertical stack 400 as shown in FIG. 4. As shown in FIG. 5A, an alignment mark 510 may be used to facilitate the face to face alignment between the top wafer 420 and the bottom wafer 410 before the wafers 410 and 420 are ready for bonding. If the alignment mark 510 is needed, an oxide trench alignment mark can be processed on the top wafer 420. When both wafers 410 and 420 are ready for bonding, the wafers 410 and 420 are aligned using a standard alignment tool and bonded using metal to metal bond, via a metal bonding layer 106. After the wafers 410 and 420 are bonded, the top wafer 420 may be thinned by a Chemical Mechanical Polish (CMP), grinding, or Silicon (Si) wet etch process so as to minimize the wiring length between the vertically stacked wafers 410 and 420. After the wafer-to-wafer bonding and silicon (Si) thinning processes are completed, one or more interwafer vias 426 can be formed at designated locations to establish electrical connections between active IC devices on the vertically stacked wafers 410 and 420 and an external interconnect (not shown). The interwafer vias 426 can be patterned by conventional lithography and the active silicon (Si) on the top wafer 420 can be etched using an etch mask.

As shown in FIG. 5B, the active silicon (Si) layer 422 of the top wafer 420 is etched using an etch mask to pattern one or more interwafer vias 426. The silicon (Si) layer 422 of the top wafer 420 is etched stopping at the tungsten "W" conductive plug 430. A thin layer of oxide 520 can then be deposited on the interwafer vias 426 so as to protect and insulate the sidewall of the interwafer vias 426. Then anisotropic oxide etch can be performed to remove the thin layer of oxide 520 at the bottom of the interwafer vias 426. In other words, the silicon (Si) via etch is performed stopping at the tungsten "W" conductive plug 430. Oxide is then deposited in the interwafer vias 426 and anisotropic oxide via etch is performed to clear a thin layer of oxide 520 at the bottom of the interwafer vias 426. There is no need for oxide via etch since the tungsten "W" plug 430 serves as electrical connection.

After the anisotropic oxide etch, a barrier/seed layer 530 can then be deposited on the oxide layer 520 and the bottom of the interwafer vias 426. After the barrier/seed layer 530, copper (Cu) 540 can then be deposited in the interwafer vias 426, via electroplating and Chemical Mechanical Polish (CMP), to establish electrical connections between active IC devices on the vertically stacked wafers 410 and 420 and an external interconnect (not shown), via the C4 bump 428 shown in FIG. 4.

In both the example 2-wafer vertical stack 200 shown in FIG. 2 and the example 2-wafer vertical stack 400 shown in FIG. 4, silicon (Si) via pattern/etch/oxide deposition steps used to protect silicon (Si) sidewall are required for electrical isolation between vias. However, these steps (Si via pattern/etch/oxide deposition) can be completed during Shallow Trench Isolation (STI) process steps in the wafer that is placed on the top (i.e., top wafer 220 shown in FIG. 2 or 420 shown in FIG. 4).

Figure 6:
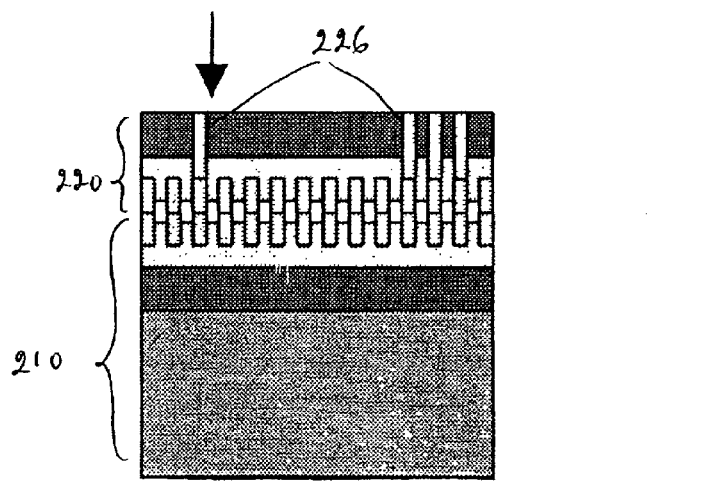
FIG. 6 illustrates an example wafer bond and via etch during STI process steps in an example 2-wafer vertical stack shown in FIG. 2.

For example, FIG. 6 illustrates an example via etch during STI process steps in the example 2-wafer vertical stack 200 shown in FIG. 2. During STI process steps, Si vias 226 can be patterned, etched, and STI oxide can then be deposited in all vias 226. When both wafers 210 and 220 are ready for bonding, the wafers 210 and 220 are aligned and bonded using metal to metal bond, via a metal bonding layer 106. After the wafers 210 and 220 are bonded, the top wafer 220 may be thinned by a Chemical Mechanical Polish (CMP), grinding, or Silicon (Si) wet etch process so as to minimize the wiring length between the vertically stacked wafers 210 and 220. After the wafer-to-wafer bonding and silicon (Si) thinning processes are completed, one or more STI oxide vias 226 can be patterned by conventional lithography and the active silicon (Si) on the top wafer 220 can be etched using an etch mask stopping at the barrier/seed or tungsten "W" contact plug. Copper (Cu) can then be deposited in the interwafer vias 226, via electroplating and Chemical Mechanical Polish (CMP), to establish electrical connections between active IC devices on the vertically stacked wafers 210 and 220 and an external interconnect (not shown), via the C4 bump 228 shown in FIG. 2.

In the example 3-D wafer-to-wafer vertical stacks as described with reference to FIG. 26, two (2) wafers are bonded face to face, and only the top wafer needs silicon (Si) vias to establish electrical connections of active IC devices between vertically stacked wafers to an external interconnect, via C4 bumps. However, when one or more additional wafers are bonded back to back on the second (top) wafer in the example 3-D wafer-to-wafer vertical stacks as described with reference to FIGS. 2–6, a large metal bonding area for wafer to wafer bonding process is required.

According to another aspect of the present invention, effective metal bonding areas on opposing surfaces of vertically stacked wafers can be made increased without consuming active silicon (Si) area by using one or more dummy Si vias, tapered Si vias, or incorporating an existing copper (Cu) dual damascene process. FIGS. 7A–7B and FIGS. 8–9 illustrate an example 4-wafer vertical stack and various techniques of increasing metal bonding areas for multiple (>2) wafer to wafer bonding process according to an embodiment of the present invention.

Figure 7A:
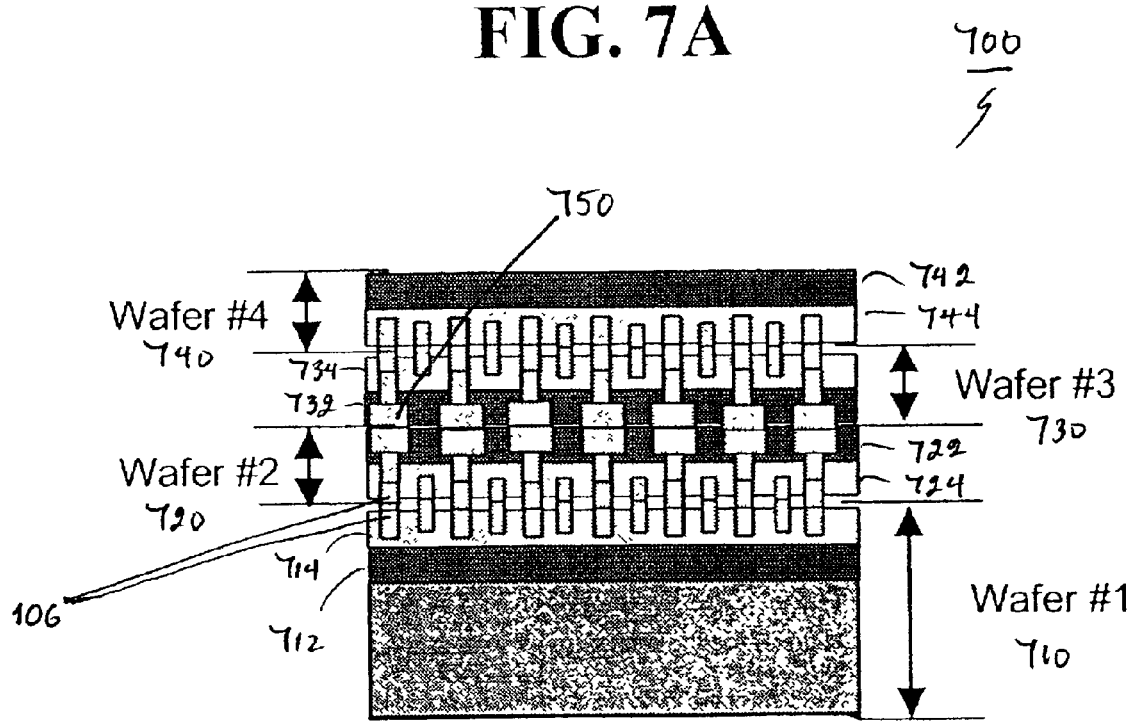
FIGS. 7A–7B illustrate an example 4-wafer vertical stack with increased metal bonding areas for multiple wafer-to-wafer bonding according to an embodiment of the present invention.
Figure 7B:
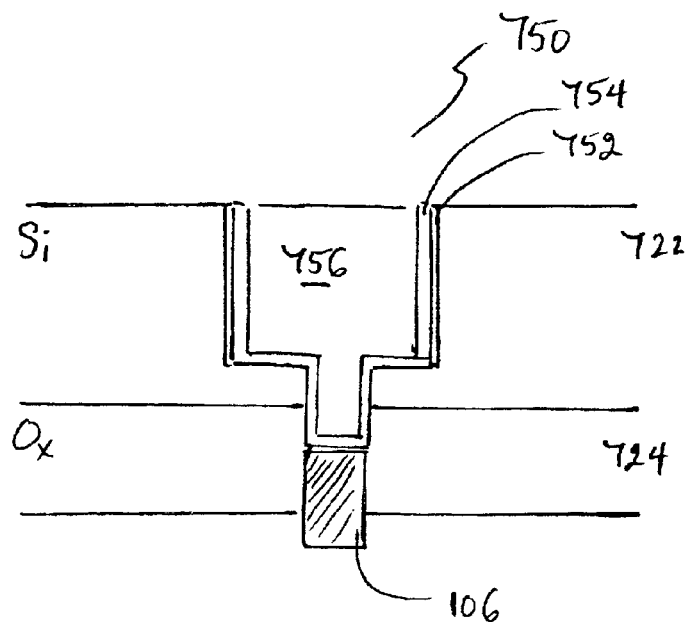

For example, FIGS. 7A–7B illustrate an example 4-wafer vertical stack with increased metal bonding areas for multiple wafer-to-wafer bonding according to an embodiment of the present invention. As shown in FIG. 7A, the multiple vertical stack 700 contains wafer #1 710 including an active layer 712 which supports one or more IC devices such as microprocessors, and an ILD (oxide) layer 714; wafer #2 720 including an active layer 722 which supports one or more IC devices such as memory devices, and an ILD (oxide) layer 724; wafer #3 730 including an active layer 732 which supports one or more IC devices such as programmable devices, and an ILD (oxide) layer 734; and wafer #4 740 including an active layer 742 which supports one or more IC devices such as radio-frequency (RF) or optical communication devices, and an ILD (oxide) layer 744. The bottom wafer 710 may be sufficiently thick to support the stacking of the top wafers 720, 730 and 740, while the top wafers 720, 730 and 740 may be thinned to minimize interconnection lengths between vertically stacked wafers 710, 720, 730 and 740.

After the first two wafers are bonded in the same manner as described with reference to FIG. 2, that is, after wafer #1 710 and wafer#2 720, and wafer #3 730 and wafer #4 740 are bonded separately, via the metal bonding layer 106, the opposing surfaces of wafer #2 720 and wafer #3 730 can be separately thinned by a Chemical Mechanical Polish (CMP), grinding, or Silicon (Si) wet etch process so as to minimize the wiring length between the vertically stacked wafers 710 and 720 and the vertically stacked wafers 730 and 740. After the wafer-to-wafer bonding and silicon (Si) thinning processes are completed, interwafer vias 750 can be formed at designated locations to establish electrical connections of active IC devices between the vertically stacked wafers 710 and 720 and the vertically stacked wafers 730 and 740. Interwafer vias 750 can be patterned with a dual damascene process. A dual damascene process involves the formation of an opening comprising a lower contact or via hole section in communication with an upper trench section, which opening is filled with a conductive material, typically a metal, to simultaneously form a conductive plug in electrical contact with a conductive line (metal bonding layer 106).

FIG. 7B illustrates a cross section of an example via 750 formed on wafer #720, for example, employing copper (Cu) dual damascene technology according to an embodiment of the present invention. As shown in FIG. 7B, the active Si layer 724 of wafer #2 720 is etched to form an upper trench section of vias. A thin layer of oxide 752 can then be deposited on the Si vias 750 so as to protect and insulate the sidewall of the Si vias 750. The oxide layer 752 as deposited on the Si vias 750 is again etched to form a lower trench section (or via contact section) of vias in the ILD layer 724 for planned dual damascene interconnects with the lower level metalization, e.g., metallic line (metal bonding layer 106). A barrier/seed layer 754 is then deposited overlying the active layer 722 and the ILD 724 in the vias and trenches. Copper (Cu) 754 is then deposited by electroplating or any other Cu deposition techniques such as metal-organic chemical vapor deposition (CVD) or plasma-enhanced metal-organic CVD.

The barrier/seed layer 754 can comprise a barrier layer deposited overlying the active layer 722 and the ILD 724 and a copper (Cu) seed layer deposited overlying the barrier layer. The barrier layer is typically comprised of a material that can eliminate out-diffusion of copper (Cu) ions from the dual damascene interconnect into the ILD layer 724, and serve as a catalyst for the copper (Cu) deposition reaction. The barrier layer preferably comprises one of the group containing: tantalum, titanium, and tungsten. The copper (Cu) seed layer deposited on the barrier layer can be made very thin while still exhibiting excellent step coverage or conformity. The copper (Cu) dual damascene process advantageously increases (Cu) metal bonding areas for multiple wafer to-wafer bonding in an example 3-D wafer-to-wafer vertical stack 700 shown in FIG. 7A.

Figure 8:
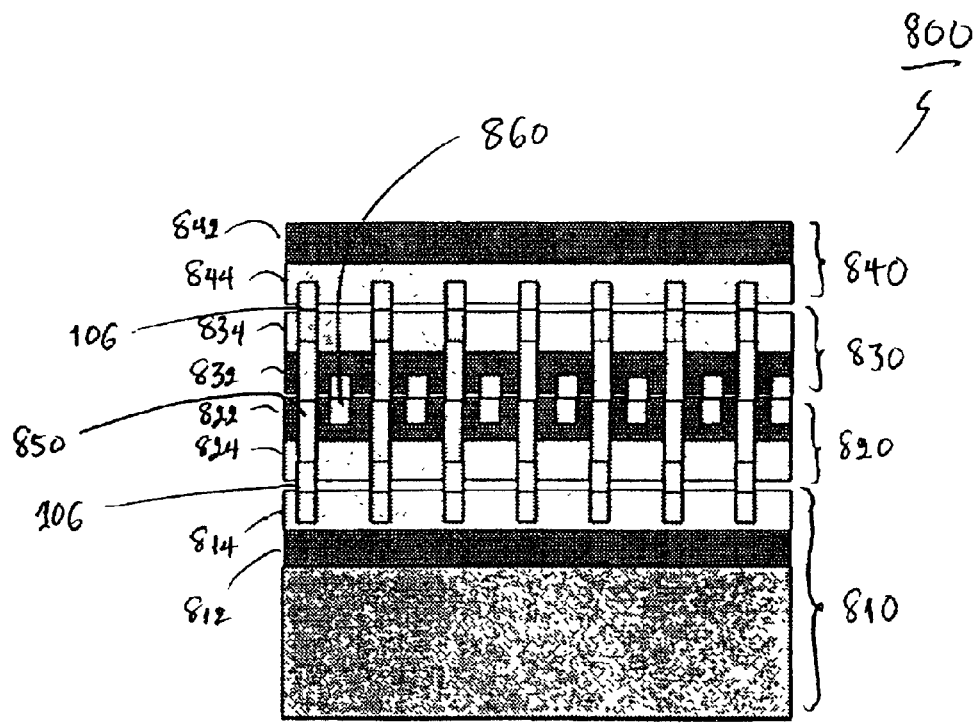
FIG. 8 illustrates example 4-wafer vertical stack with increased metal bonding areas for multiple wafer-to-wafer bonding according to another embodiment of the present invention.

FIG. 8 illustrates example 4-wafer vertical stack with increased metal bonding areas for multiple wafer-to-wafer bonding according to another embodiment of the present invention. As shown in FIG. 8, the multiple vertical stack 800 contains the same number of wafers as described with reference to FIGS. 7A–7B, comprising, for example, wafer #1 810 including an active layer 812 which supports one or more IC devices, and an ILD (oxide) layer 814; wafer #2 820 including an active layer 822 which supports one or more IC devices, and an ILD (oxide) layer 824; wafer #3 830 including an active layer 832 which supports one or more IC devices, and an ILD (oxide) layer 834; and wafer #4 840 including an active layer 842 which supports one or more IC devices, and an ILD (oxide) layer 844.

After the first two wafers are bonded in the same manner as described with reference to FIG. 2, that is, after wafer #1 810 and wafer#2 820, and wafer #3 830 and wafer #4 840 are bonded separately, via the metal bonding layer 106, the opposing surfaces of wafer #2 820 and wafer #3 830 can be separately thinned by a Chemical Mechanical Polish (CMP), grinding, or Silicon (Si) wet etch process so as to minimize the wiring length between the vertically stacked wafers 810 and 820 and the vertically stacked wafers 830 and 840. After the wafer-to-wafer bonding and silicon (Si) thinning processes are completed, interwafer (interconnect) vias 850 can be formed at designated locations to establish electrical connections of active IC devices between the vertically stacked wafers 810 and 820 and the vertically stacked wafers 830 and 840. Interwafer vias 850 and additional dummy vias 860 can be patterned with the same damascene process as described with reference to FIG. 2. However, dummy via size can be made smaller in diameter than interwafer vias 850.

For example, the active Si layer 824 of wafer #2 820 can be etched to form Si vias 850 and dummy vias 860. An oxide layer (not shown) can then be deposited only on the Si vias 850 so as to protect and insulate the sidewall of the Si vias 850. The oxide layer (not shown) deposited on the Si vias 850 can again be patterned and etched to form a lower contact or via hole (trench) section in the ILD layer 824 with the lower level metalization, e.g., metallic line (metal bonding layer 106). A barrier/seed layer (not shown) can then be deposited overlying the active layer 822 and the ILD 824 in the vias and trenches. Copper (Cu) is then deposited by electroplating or any other Cu deposition techniques such as metal-organic chemical vapor deposition (CVD) or plasma-enhanced metal-organic CVD. As a result, dummy vias 860 can serve as additional metal bonding pads to increase the surface of (Cu) metal bonding areas for multiple (>2) wafer to-wafer bonding in an example 3-D wafer-to-wafer vertical stack 800, as shown in FIG. 8, while providing auxiliary structures such as ground planes or heat conduits for the active IC devices in the vertically stacked wafers 810, 820, 830 and 840.

Figure 9:
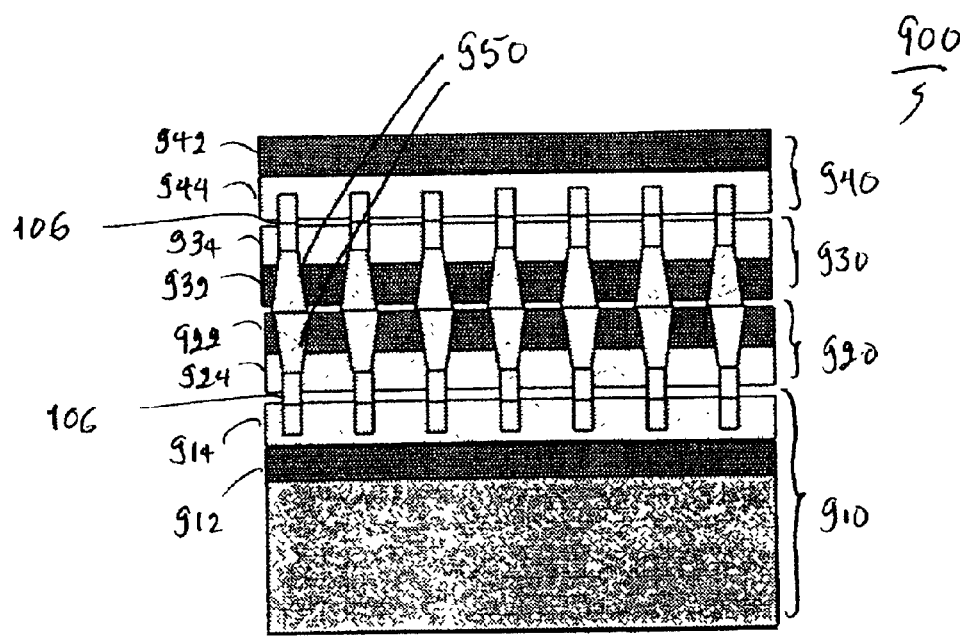
FIG. 9 illustrates an example 4-wafer vertical stack with increased metal bonding areas for multiple wafer-to-wafer bonding according to yet another embodiment of the present invention.

FIG. 9 illustrates an example 4-wafer vertical stack with increased metal bonding areas for multiple wafer-to-wafer bonding according to yet another embodiment of the present invention. As shown in FIG. 9, the multiple vertical stack 900 contains the same number of wafers as described with reference to FIGS. 7A–7B and FIG. 8, comprising, for example, wafer #1 910 including an active layer 912 and an ILD (oxide) layer 914; wafer #2 920 including an active layer 922 and an ILD (oxide) layer 924; wafer #3 930 including an active layer 932 and an ILD (oxide) layer 934; and wafer #4 940 including an active layer 942 and an ILD (oxide) layer 944.

After the first two wafers are bonded in the same manner as described with reference to FIG. 2, that is, after wafer #1 910 and wafer#2 920, and wafer #3 930 and wafer #4 940 are bonded separately, via the metal bonding layer 106, the opposing surfaces of wafer #2 920 and wafer #3 930 can be separately thinned by a Chemical Mechanical Polish (CMP), grinding, or Silicon (Si) wet etch process so as to minimize the wiring length between the vertically stacked wafers 910 and 920 and the vertically stacked wafers 930 and 940. After the wafer-to-wafer bonding and silicon (Si) thinning processes are completed, interwafer vias 950 can be formed at designated locations to establish electrical connections of active IC devices between the vertically stacked wafers 910 and 920 and the vertically stacked wafers 930 and 940. Interwafer vias 950 can be patterned with the same damascene process as described with reference to FIG. 2. However, the etching process of Si vias 950 can be controlled such that the Si vias 950 can be tapered from the top to the bottom via hole. As a result, tapered vias 950 can have a larger surface area so as to increase the (Cu) metal bonding areas for multiple wafer to-wafer bonding in an example 3-D wafer-to-wafer vertical stack 900.

The example Si via process can be described as follows: The active Si layer 924 of wafer #2 920 can first be patterned and etched at a predetermined angle to form tapered vias 950. An oxide layer (not shown) can then be deposited only on the tapered vias 950 so as to protect and insulate the sidewall of the tapered vias 950. The oxide layer (not shown) deposited on the tapered vias 950 can again be patterned and etched to form a lower contact or via hole section in the ILD layer 924 with the lower level metalization, e.g., metallic line (metal bonding layer 106). A barrier/seed layer (not shown) can then be deposited overlying the active layer 922 and the ILD 924 in the tapered vias 950. Copper (Cu) is then deposited by electroplating or any other Cu deposition techniques such as metal-organic chemical vapor deposition (CVD) or plasma-enhanced metal-organic CVD.

As described in this invention, there are several processes of vertically stacking multiple wafers supporting different active IC devices with low cost and high via density. Metal bonding areas on wafers can be increased by using either a copper (Cu) dual damascene process, dummy vias, or tapered vias to effectively bond vertically stacked wafers and establish electrical connections between active IC devices on the vertically stacked wafers and an external interconnect (not shown), via C4 bumps.

While there have been illustrated and described what are considered to be exemplary embodiments of the present invention, it will be understood by those skilled in the art and as technology develops that various changes and modifications may be made, and equivalents may be substituted for elements thereof without departing from the true scope of the present invention. Many modifications may be made to adapt the teachings of the present invention to a particular situation without departing from the scope thereof. Therefore, it is intended that the present invention not be limited to the various exemplary embodiments disclosed, but that the present invention includes all embodiments falling within the scope of the appended claims.

What is claimed is:

1. A method of vertically stacking wafers, comprising:
    selectively depositing a plurality of metallic lines on opposing surfaces of each of a first wafer and a second wafer;
    bonding the first wafer to the second wafer by bonding the respective metallic lines on opposing surfaces of the first wafer and the second wafer to create a vertically stacked wafer pair;
    forming one or more vias to establish electrical connections between the active devices on each wafer of the vertically stacked wafer pair and an external interconnect, the vias tapered from top to bottom hole, such that a top surface of each via has a larger area than a bottom surface; and
    bonding two vertically stacked wafer pairs together by bonding the top surfaces of each of the one or more vias of a first vertically stacked wafer pair to corresponding top surfaces of each of the one or more vias of a second vertically stacked wafer pair.

2. The method as claimed in claim 1, wherein each via is formed by:
    selectively etching the top wafer to form a via;
    depositing an oxide layer to insulate a sidewall of the via;
    forming a barrier/seed layer in the via;
    depositing a barrier layer in the via;
    depositing a seed layer on the barrier layer; and
    depositing a conduction metal on the seed layer in the via for providing an electrical connection between active devices on the vertically stacked wafers and the external interconnect.

3. The method as claimed in claim 1, wherein the metallic lines are Copper (Cu) lines deposited to serve as electrical contacts between active devices on the vertically stacked wafers.

4. The method as claimed in claim 2, wherein the conduction metal deposited in the via is copper (Cu) or a Cu alloy.

5. The method as claimed in claim 2, wherein the barrier layer is comprised of a material selected from one of the group including tantalum (Ta), tantalum nitride (TaN), titanium (Ti), and tungsten (W), and the Cu seed layer is comprised of a thin layer of copper (Cu) deposited on the barrier layer by chemical vapor deposition (CVD) process.

6. The method as claimed in claim 1, further comprising dummy vias arranged on opposing surfaces of the adjacent wafers to increase the surface area for wafer-to-wafer bonding and serve as auxiliary structures for the active devices on the vertically stacked wafers.

7. The method as claimed in claim 1, wherein each via is formed by a dual damascene process comprised of:
    selectively etching the top wafer to form an upper trench section of a via;
    depositing an oxide layer to insulate a sidewall of the upper trench section of the via;
    selectively etching the oxide layer in the upper trench section of the via to form a lower trench section of the via;
    depositing a barrier layer in the via;
    depositing a seed layer on the barrier layer; and
    depositing a conduction metal on the seed layer for providing an electrical connection between active devices on the vertically stacked wafers and an external interconnect.

8. The method as claimed in claim 7, wherein the barrier layer is comprised of a material selected from one of the group including tantalum (Ta), tantalum nitride (TaN), titanium (Ti), and tungsten (W), and deposited in the upper trench section overlying the oxide layer and the lower trench section of the via; and the copper (Cu) seed layer is comprised of a thin layer of copper (Cu) deposited on the barrier layer deposited overlying the barrier layer in both the upper trench section and the lower trench section of the via.

9. The method as claimed in claim 1, wherein the vias are formed during a Shallow Trench Isolation (IST) process in the top wafer before the adjacent wafers are bonded, via the respective metallic lines deposited on opposing surfaces of the adjacent wafers.

* * * * *

UNITED STATES PATENT AND TRADEMARK OFFICE
CERTIFICATE OF CORRECTION

PATENT NO. : 6,762,076 B2 Page 1 of 1
DATED : July 13, 2004
INVENTOR(S) : Kim et al.

It is certified that error appears in the above-identified patent and that said Letters Patent is hereby corrected as shown below:

Column 7,
Line 58, delete "FIG 26" and insert -- FIGs 2-6 --.

Signed and Sealed this

Thirtieth Day of November, 2004

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 6,762,076 B2 |
| APPLICATION NO. | : 10/077967 |
| DATED | : July 13, 2004 |
| INVENTOR(S) | : Kim et al. |

Page 1 of 1

It is certified that error appears in the above-identified patent and that said Letters Patent is hereby corrected as shown below:

In column 12, at line 41, delete "(IST)" and insert --(STI)--.

Signed and Sealed this

Twenty-second Day of May, 2007

JON W. DUDAS
*Director of the United States Patent and Trademark Office*